PROCESS FOR MAKING PRINTED CIRCUITS

Filed March 29, 1956 2 Sheets-Sheet 1

INVENTOR
E. E. FRANZ DECEASED
ADA L. FRANZ
HIS EXECUTRIX
BY John C Morris
ATTORNEY

PROCESS FOR MAKING PRINTED CIRCUITS

Filed March 29, 1956 2 Sheets-Sheet 2

INVENTOR
E. E. FRANZ DECEASED
ADA L. FRANZ
HIS EXECUTRIX
BY John C Morris
ATTORNEY

United States Patent Office 2,969,300

Patented Jan. 24, 1961

2,969,300

PROCESS FOR MAKING PRINTED CIRCUITS

Erwin E. Franz, deceased, late of Cranford, N.J., by Ada L. Franz, executrix, Cranford, N.J., assignor to Bell Telephone Laboratories, Incorporated, New York, N.Y., a corporation of New York

Filed Mar. 29, 1956, Ser. No. 574,849

2 Claims. (Cl. 154—96)

This invention relates to a process for making electrical devices; more particularly, this invention relates to the fabrication of printed circuits.

A printed circuit is generally regarded as the combination of printed wiring with electrical components. The term printed wiring refers to a conductive pattern, however made, placed on an insulating support and used to interconnect electrical components.

During the past few years an increasing demand for printed circuits has risen as their potentialities have been more fully appreciated. Printed circuits, and printed wiring in particular, have emerged from a laboratory development stage to become one of the most promising aids to the mass production of electrical devices. The use of printed circuits results in great precision, ease, and economy of manufacture and a considerable compactness when compared to the usual type of wired circuits; and so their use is being applied to the design of a great variety of electrical apparatus.

There are many known methods for producing a conductive pattern on an insulating support or base. For example, printed wiring may be formed by chemical removal of unwanted metal from a metal clad base, or it may be formed by printing, painting, or plating the desired conductive pattern on an insulating base. The first named method and the plating method have the disadvantage of chemical contamination of the base material. The contamination may adversely affect the electrical characteristics of the insulating base material. Painted and printed conductors may present soldering difficulties, and often have the further disadvantage of varying conductor resistance. Other known methods are subject to these and other disadvantages. For example, some techniques provide a conductive pattern which has a low peel strength; that is, only a low force is required to separate the pattern from the base. Other processes for making printed circuits adversely alter the water absorption characteristics of the base material, and some methods result in mechanical damage to the base material.

Accordingly it is a principal object of this invention to provide a new and improved process for making low cost, reliable electrical apparatus.

A further object of the invention is to facilitate the interconnection of the terminations of electrical components.

More specifically, it is an object of the invention to provide a new, high speed method for making printed circuits.

It is a further object of the invention to provide a process for making printed circuits that does not result in degradation of the base material by chemical action.

A still further object of the invention is to provide a process for making printed circuits characterized in that a conductive pattern produced thereby exhibits excellent adhesion to the base material.

Processes in accordance with this invention produce a type of printed wiring which for purposes of apt description may be referred to as applique wiring. The applique wiring pattern is itself produced mechanically first and is then made to adhere to the surface of the base material. Advantageously, in the finished printed wiring board, the applique pattern is embedded into the surface of the base material.

In one specific illustrative embodiment of this invention a thin metallic foil and a conveyor or tape are made to move longitudinally in intimate contact, an adhesive being provided on a mating surface of the foil or the tape. With the tape and foil thus joined together, the desired conductive pattern is cut from the foil and simultaneously applied to the tape, as by a dinking die. Pressure applied to the dinking die both cuts the pattern and applies the cut applique pattern to the tape. In accordance with an aspect of this invention the tape conveyor then carries the dinked conductive pattern to the subsequent locations for positioning of the applique pattern on the insulating base or support. The remainder of the conductive foil, from which the pattern has been cut, is removed from the tape. Dinking is an inexpensive process using a dinking or skeletal die, which is one having line cutting edges. This type of die has a low initial tool cost, and is particularly well suited to the automatic manufacture of printed circuits.

When the conductive pattern is being carried by the conveyor tape, the insulating board can be applied thereto in a number of ways in accordance with different specific embodiments of this invention. In accordance with one process a board having an adhesive coating thereon is placed under the tape which has the conductive pattern on its lower surface. Pressure is then applied to secure the board to the tape and the conductive pattern by means of this adhesive. Because of the presence of the adhesive and depending on the thickness of the adhesive coating, the conductive applique pattern is embedded into the adhesive. The pattern and the board secured thereto are then conveyed by the tape to a curing oven or other curing apparatus where the adhesive is cured and becomes a part of the base insulating member itself, so that the conductive pattern is embedded directly into the insulating base. The board with the applique pattern thereon is then separated from the tape.

In accordance with another specific illustrative embodiment of this invention a casting frame is positioned on the conveyor tape and around the dinked conductive pattern. A suitable insulating material, such as a thermosetting resin, is poured into this frame. The tape then conveys the frame, with the insulating material therein and on top of the conductive pattern, to a curing station where the insulating material is cured to form an insulating base. As the base is thus formed directly on the conductive pattern, the pattern is embedded into the surface of the formed insulating member. The frame is then removed from the insulating member, and the insulating member and embedded applique pattern are removed from the conveyor tape.

Accordingly it is a feature of this invention that a printed wire or printed circuit board be formed by a series of steps including cutting a conductive pattern from a thin conducting foil and applying that pattern to a conveyor tape, the tape serving to carry or convey the conductive pattern during the subsequent steps of the process.

It is another feature of this invention that the conductive pattern be cut from the conductive foil and applied to the conveyor tape simultaneously. More specifically in accordance with this invention the pattern is cut from the foil by a dinking die which applies pressure to the foil to join it to the tape, one of the mating surfaces of the foil and tape being coated with a pressure sensitive adhesive to effect this joining.

It is a further feature of this invention that the insulating board is applied to the conductive pattern while it is being carried by the conveyor tape. In one specific embodiment of this invention this is attained by positioning an insulating board to which adhesive has been applied under the conductive pattern, which is being carried on the lower surface of the tape, and joining the two by pressure; the adhesive is subsequently cured, while the board and pattern are still carried by the tape, and then the tape is removed. In another specific illustrative embodiment of this invention a frame is placed on top of the conveyor tape and around the conductive pattern and the insulating board formed in place within the frame, the conveyor tape serving to carry the apparatus and frame during the different steps of the process.

A complete understanding of the invention and of these and other features and advantages thereof may be gained from consideration of the following detailed description in conjunction with the accompanying drawing, in which.

Figures 4, 5:
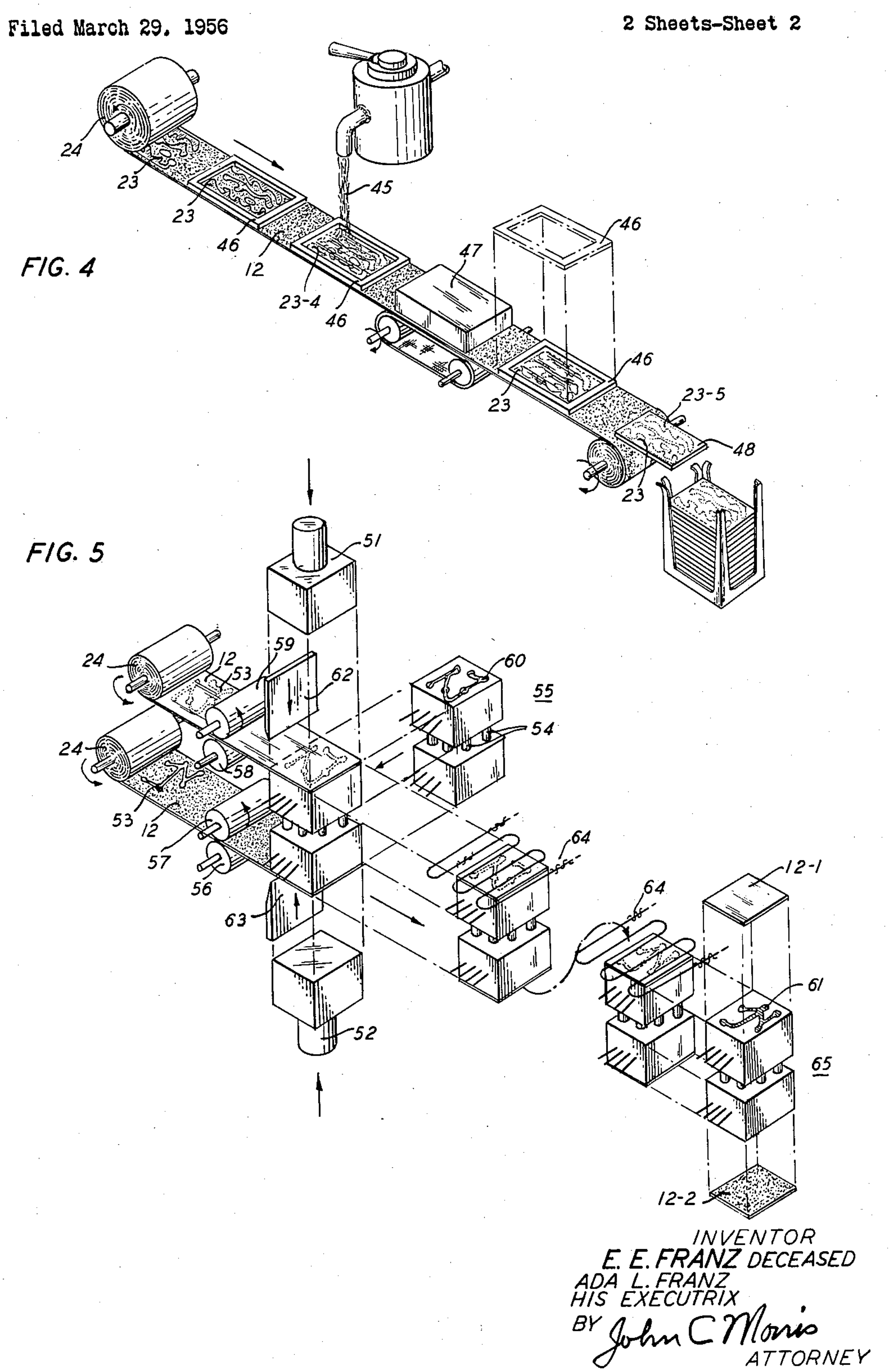

Fig. 4 is a perspective view of apparatus for casting an insulating base onto a conductive pattern on the conveyor tape in accordance with another specific illustrative embodiment of this invention; and Fig. 5 is a perspective view of apparatus for applying to a matrix structure a conductive pattern on the conveyor tape in accordance with still another specific illustrative embodiment of this invention.

Figures 1, 2, 3:
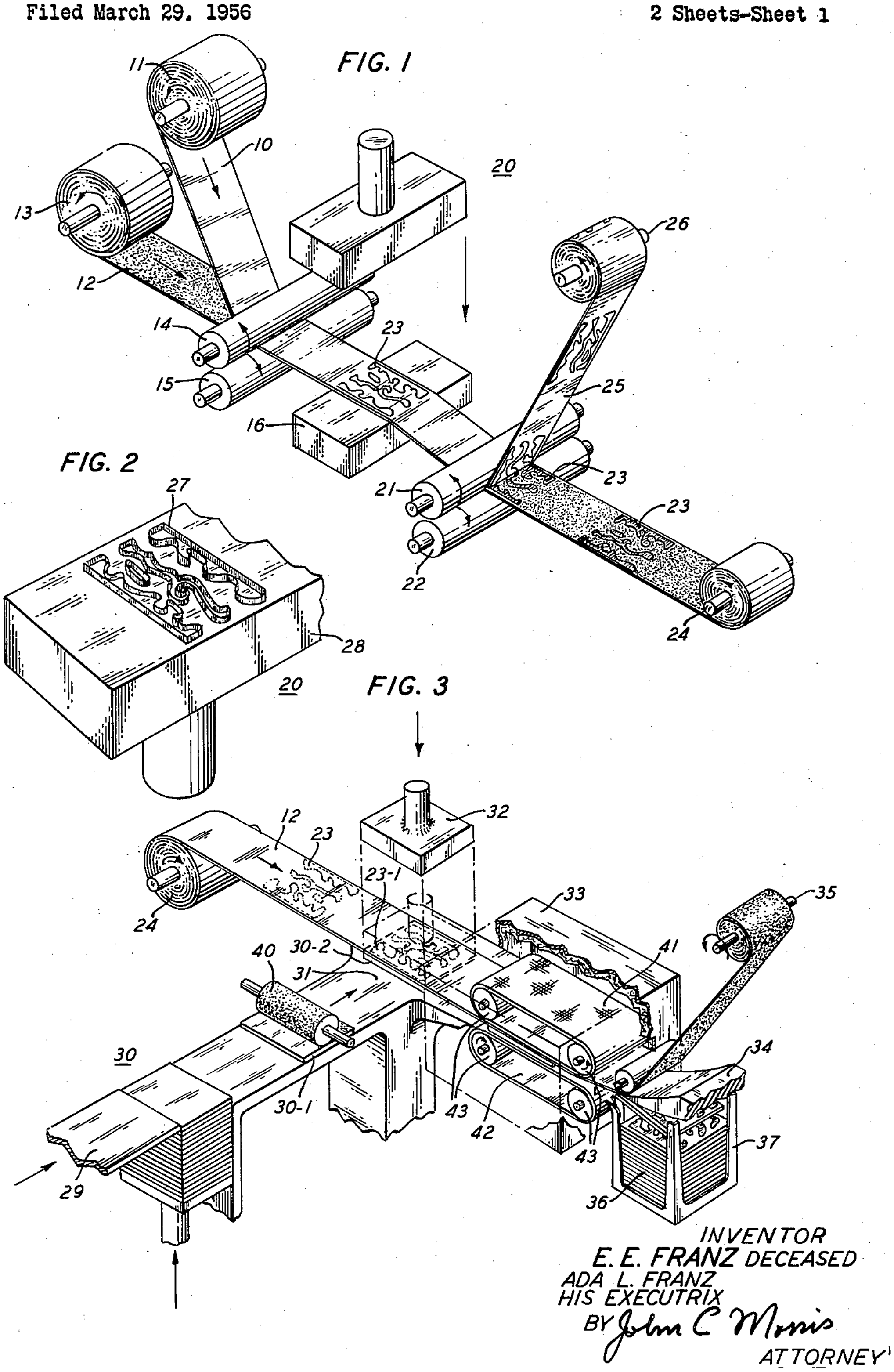
Fig. 1 is a perspective view of apparatus for applying a conductive pattern to a conveyor tape in accordance with one specific illustrative embodiment of this invention.
Fig. 2 is a perspective view of the surface of the dinking die employed in the apparatus of Fig. 1.
Fig. 3 is a perspective view of apparatus for applying the insulating base to a conductive pattern on the conveyor tape in accordance with one specific illustrative embodiment of this invention.

Referring now to the drawing, Fig. 1 shows apparatus for performing the initial process steps involved in preparing conductive patterns according to the invention. A strip of foil 10 is supplied from a supply roll 11 while a pressure-sensitive, low tack, high temperature resistant tape 12 is supplied from a supply roll 13. The tape may advantageously be made of paper. The paper tape 12 acts as a conveyor for the foil 10 and the conductive patterns which are severed therefrom. The foil 10 is a thin sheet of some suitable conductive material. Tinned rolled copper has been found to be well suited for foil material. The foil will serve its intended purpose if it has a thickness of the order of a few thousandths of an inch. Only the upper side of the paper tape 12 shown in Fig. 1 is coated with adhesive, and this coated side is brought into intimate contact with the metal foil 10 by the pressure contacting rollers 14 and 15. However, it is not intended to restrict the process of the invention to an uncoated foil and a coated tape, as coated foil and coated or uncoated tape may be used.

After emerging from the pressure contacting rollers the paper tape 12 and the foil 10 are moved onto a die anvil element 16. A dinking die, generally designated 20, which may be of the steel rule or engraved type, cuts the desired conductive pattern from the metal foil 10 without cutting into the conveyor paper tape 12.

The dinked portion 23 of the metal foil 10 and the remainder, or skeleton, of the foil are moved from the die anvil 16 through the rollers 21 and 22. The moving belt of tape and foil is separated as it moves out from the rollers 21 and 22. The tape with the dinked conductive patterns 23 adhering thereto may be stored on a roller 24, or, advantageously, the tape and patterns may be moved directly from the rollers 21 and 22 to the apparatus shown in Fig. 3, or Fig. 4, or Fig. 5 where the process steps hereinafter described are performed. The foil skeleton 25 is directed upwards onto a roller 26. The foil skeleton 25 is salvaged and ultimately reused in the process steps above described. Thus, the process of the invention is extremely economical in its use of conductive materials.

Fig. 2 illustrates a dinking die 20 of the type that may be used in the process of Fig. 1. Line type cutting edges 27 are shown secured in a holder 28.

Referring now to Fig. 3, there are depicted the apparatus and the process steps involved in applying a foil conductive pattern to an insulating base in accordance with one specific illustrative embodiment of this invention. The bases generally designated 30 are of some suitable high grade insulating material of which there is a wide range and variety commercially available. Epoxide resins, for example, are well suited to the manufacture of the bases 30. Unfilled, filled, or reinforced epoxies may be used and the bases may be laminated or not.

A positioning member 29 directs each base past an adhesive coating roller 40 and places it directly beneath the movable conveyor tape 12 which may be fed directly from the rollers 21 and 22 (Fig. 1) or from a storage roll 24.

The roller 40 is shown applying an adhesive coating to a base 30–1. A thermosetting resin may be used as the adhesive. Advantageously the bases and the adhesive applied thereto are of the same material.

A dinked conductive pattern 23–1 is carried onto an adhering anvil 31 by the movable paper tape carrier 12 and a suitably coated base 30–2 moved by the positioning member 29, is placed directly beneath the pattern 23–1, the coated side of the base 30–2 facing the pattern 23–1. An adhering punch 32 may then apply sufficient pressure to the non-tacky side of the paper tape 12 to insure that the pattern 23–1 is impressed into the adhesive coating on the base 30–2 up to substantially the thickness of this coating. Thus, when the coating is cured the conductive pattern 23–1 will be securely embedded in the face of the base 30–2. The depth of embedment is of course, related to the thickness of the adhesive coating applied to the bases 30 and to the pressure of the adhering punch.

In operation the positioning member 29 will move a base from the spring biased pile-up of such base to the position, indicated by base 30–1, where the adhesive is applied, and then directly to the position on the anvil 31 under the conductive pattern 23–1, as indicated by the base 30–2. Accordingly when base 30–1 is under the roller 40, the positioning member 29 would be on top of the pile-up of bases 30. However, for reasons of clarity in explaining the operation of the apparatus and to aid in depicting the invention the positioning member is shown retracted, allowing the next base 30 to rise into position, and bases 30–1 and 30–2 are shown at their respective positions where they are operated upon by the other elements of the apparatus, as described above.

An oven 33 may advantageously be used to cure the adhesive material applied to the bases 30. Belts 41, 42 and rollers 43 maintain each base and pattern in intimate contact during the curing process. The cured adhesive permanently bonds each base and its associated pattern together to form a unitized panel. The pressure sensitive conveyor tape 12 is then stripped off each base 30, for example, by a stripping finger 34. The conveyor tape is then wound onto a roller 35, and the applique wired panels 36, complete except for several finishing operations, briefly described below, are stacked in a storage bin 37.

Prior to the adhesive coating step, the bases 30 may be perforated by suitable means. In this event, the embedded pattern 23 is perforated subsequent to the adhesive curing step so that the base holes and the pattern holes register or align. More advantageously, any desired holes can be formed in the panels 36 subsequent to the adhesive curing step. Alignment problems are then, of course, eliminated. Electrical components are mounted on the perforated panels, and the component terminations are, advantageously, spaded or bent and then electrically secured to the conductive patterns 23 by dip soldering or by flooding the panels 36 with solder, or by other means known to those skilled in the art of printed circuits. Since, as above described, the conductive patterns are advantageously embedded in the bases, lifting or peeling of the conductive patterns during the finishing operations, or thereafter is virtually completely eliminated.

The possibility of peeling or lifting of a conductive pattern and adverse humidity effects upon an applique wired panel may be reduced to an absolute minimum by overlaying the base and pattern with an insulating material that is bondable to the base and suitably perforated to leave contact areas of the pattern exposed. Or, advantageously, after electrical components have been mounted and electrically secured to the wired panel, the panel may, then, be completely overlaid with a suitable insulating material.

Fig. 4 depicts apparatus for performing the process steps of a second illustrative embodiment of the invention. In this embodiment suitable insulating material 45, such as a thermosetting catalyzed resin, is poured onto a dinked conductive pattern 23–4 and within a casting frame 46 placed on the tape conveyor 12. A heated cope 47 cures the poured insulating material to form an insulating base 48. These process steps result in a unitized structure wherein the conductive pattern 23–5 and the face of the base 48 in which the pattern is embedded lie in the same plane. Thus, the pattern presents no edges which are likely to peel.

Fig. 5 shows how conductive patterns 53 made in accordance with the invention may be used for interconnecting components 54 in a matrix structure 55 in accordance with still another specific illustrative embodiment of this invention. The matrix structure 55 is similar to that disclosed in my Patent 2,862,992, issued December 2, 1958. The patterns 53, which may be of solder foil, are carried by pressure sensitive tapes, moved through the rollers 56, 57 and 58, 59, and placed or seated in the grooves or channels 60 and 61 in the top and bottom surfaces respectively of the matrix structure 55 by the adhering punches 51, 52. The conductive patterns 53 are temporarily secured in the matrix grooves by the pressure sensitive tapes. The tapes may be cut by means of cutting members 62, 63, and the matrix is transferred to a heating member 64 which causes the solder patterns 53 to flow and to effect electrical connection among the matrix components 54. Advantageously, the top of the matrix structure is first heated and the solder pattern therein caused to flow and then allowed to set, and then, as indicated on Fig. 5, by the S-shaped arrow, the matrix is turned over and the other solder pattern is heated, caused to flow, and allowed to set. The solder patterns 53 may be inductively fused or simply heated with a hot platen, with or without agitation. The pressure sensitive tapes 12–1 and 12–2 are then removed leaving the interconnected matrix structure, generally designated 65.

The applique wiring process herein described exhibits great flexibility and is admirably suited to apply conductive patterns to other than planar surfaces. Further, in practising the process of the invention, a flexible rather than a rigid base may be used.

Although epoxy resin insulating materials and tinned copper conductors have been described as representative materials for the process steps of the invention, it is not intended that this novel process should be limited thereby. Polystyrene, vinyl chloride, or any high grade insulating material may be substituted for the epoxy resin. Various types of coated foil that exhibit good conductive properties may be used in place of tinned copper foil.

To conserve space, dinked conductive patterns, carried on a conveyor tape, could be adhered to both sides of an insulating base. The conductors could also be wrapped around and adhered to a cube, a rectangular block, an angle, a channel, and a great variety of other surfaces.

In accordance with this invention, applique wired structures adaptable to a wide variety of design needs and having the properties required to insure reliability and long life are produced at reasonable cost.

It is to be understood that the above-described arrangements are illustrative and not restrictive of the principles of the invention. Other arrangements may be devised by those skilled in the art without departing from the spirit and scope of the invention.

What is claimed is:

1. In the fabrication of printed circuits, a continuous method comprising the steps of causing a thin continuous conductive metallic foil to travel contiguous to a continuous paper carrier tape to a first work position, one of the contiguous surfaces of the foil and carrier tape having a coating thereon so as to insure a slight degree of adherence therebetween, dinking circuit patterns from successive portions of the continuous conductive foil and applying them to successive portions of the continuous carrier tape at said first work position to cause them to adhere to the carrier tape, moving said contiguous foil and carrier tape from said first work position and removing from the carrier tape the remaining portions of said continuous conductive foil not a part of said circuit patterns thereby leaving only said circuit patterns in stored positions on said continuous carrier tape, moving said carrier tape to a second work position, successively bringing insulating members into contact with the stored patterns on said carrier tape at said second work position, moving said carrier tape and insulating members to a third work position, applying heat at said third work position to said insulating members and said stored patterns to permanently bond said insulating members and said patterns together at said third work position, moving said continuous carrier tape having the stored patterns and bonded insulating members thereon from said third work position, and then separating said bonded members and patterns from the successive portions of said continuous carrier tape, characterized in that in said dinking step said paper carrier tape is indented but not cut into, said circuit patterns are affixed to said paper carrier tape in an easily separable manner by adhesion only.

2. A method as in claim 1 wherein the step of bringing insulating members into contact with the successive stored patterns on said carrier tape comprises feeding insulating boards into contact with said successive stored patterns on said continuous carrier tape.

References Cited in the file of this patent

UNITED STATES PATENTS

| | | |
|---|---|---|
| 2,447,541 | Sabee et al. | Aug. 24, 1948 |
| 2,647,852 | Franklin | Aug. 4, 1953 |
| 2,692,190 | Pritikin | Oct. 19, 1954 |
| 2,721,822 | Pritikin | Oct. 25, 1955 |
| 2,747,977 | Eisler | May 29, 1956 |